United States Patent [19]
Shacklett, III et al.

[11] Patent Number: 5,925,480
[45] Date of Patent: Jul. 20, 1999

[54] THERMOCHROMIC BATTERY TESTER

[75] Inventors: James H. Shacklett, III, Gwynned Valley; Philip M. Henry, Morrisville; Richard Snyder, Gilbertsville, all of Pa.

[73] Assignee: National Label Company, Lafayette Hill, Pa.

[21] Appl. No.: 08/721,633

[22] Filed: Sep. 26, 1996

[51] Int. Cl.⁶ .................................................. H01M 10/48
[52] U.S. Cl. ............................ 429/93; 324/427; 324/435
[58] Field of Search .................................. 429/90, 91, 92, 429/93, 94; 324/104, 435, 437, 427

[56] References Cited

U.S. PATENT DOCUMENTS

| | | |
|---|---|---|
| 5,015,544 | 5/1991 | Burroughs et al. . |
| 5,059,895 | 10/1991 | Cataldi et al. ........................ 324/104 |
| 5,223,003 | 6/1993 | Tucholski et al. ..................... 29/623.4 |
| 5,389,458 | 2/1995 | Weiss et al. .............................. 429/90 |
| 5,393,618 | 2/1995 | Weiss et al. . |
| 5,409,788 | 4/1995 | Weiss et al. .............................. 429/93 |
| 5,538,806 | 7/1996 | Weiss et al. . |
| 5,557,208 | 9/1996 | Parker ..................................... 324/435 |
| 5,604,049 | 2/1997 | Weiss et al. .............................. 429/93 |

*Primary Examiner*—Stephen Kalafut
*Attorney, Agent, or Firm*—Reed Smith Shaw & McClay LLP

[57] ABSTRACT

A battery tester device that may be integrated into a label of battery. The battery tester device includes first dielectric layer, a conductive layer adjacent the first dielectric layer, a temperature sensitive indicator layer in thermal contact with the conductive layer, and thermal insulation adjacent the conductive layer. The thermal insulation includes a second dielectric layer and thermally insulative material combined with the second dielectric layer for enhancing the structural strength of the second dielectric layer.

22 Claims, 4 Drawing Sheets

THERMOCHROMIC BATTERY TESTER

FIELD OF THE INVENTION

The present invention relates in general to devices for testing the capacity of a battery and, more particularly, to a battery tester that may be integrated into the label of a battery.

BACKGROUND OF THE INVENTION

Batteries of all types, whether frequently or rarely used, discharge with the passage of time. Accordingly, when placed into service, the battery or batteries that provide the energy source for electronic equipment such as flashlights, toys, radios, audiocassette players, compact disc players and myriad other devices, may or may not have sufficient charge to power the equipment. As a consequence, a variety of devices have been proposed whereby a user can determine a battery's energy level with reasonable certainty.

Perhaps the earliest known battery testers, which remain in common usage, include specifically designated voltmeters and ammeters. Although quite accurate when properly calibrated and operated, such devices are cumbersome to use, must be carefully maintained and stored, and can be rather expensive.

More recently, battery testers have been incorporated into battery packaging containers. These testers, generally referred to as thermochromic testers, normally compromise an electrically conductive layer in thermal contact with a temperature sensitive color indicator layer. When the ends of the conductive layer are contacted with a battery's terminals, electronic current flows through and creates heat in the conductive layer. The heat so generated causes a change in the indicator layer if the voltage of the battery exceeds a predetermined threshold. Tester devices of this sort are somewhat difficult to operate because a user must precisely align and maintain contact of the tester's terminals with the battery's terminals to achieve reliable results. In addition, the tester is usually capable of testing the condition of only a single size of battery, e.g., a AA battery. Moreover, the battery packaging itself, which is bulky and susceptible to damage, must be retained and carefully stored, although it is commonly misplaced or discarded as trash.

Even more recently, thermochromic testers have been incorporated into the labels encasing the batteries themselves. Examples of such built-in testers may be found in U.S. Pat. No. 5,015,544. Testers of this sort are in immediate contact with the typically metal housings of the batteries to which they are attached. As such, the battery may act as a heat sink for the heat generated during operation of the tester. If not controlled this loss of heat may hinder the function of both the tester and the battery. For instance, to achieve the threshold temperature sufficient to effect a change in the color indicator layer, the tester may have to be operated for a longer period of time than would otherwise be desired, thereby prematurely draining the battery of useful energy. Additionally, the loss of tester heat into the battery may cause the tester to produce inaccurate readings of the battery's strength, i.e., the tester might indicate the battery to be drained when in fact the battery is still useful. In these circumstances, a user might mistakenly discard good batteries in reliance upon the errant readings of the tester.

To alleviate battery heat sink problems, U.S. Pat. Nos. 5,059,895, 5,223,003, 5,389,458, 5,393,618, 5,409,788 and 5,538,806 have proposed placement of thermal insulation means between the conductive layer of a thermochromic battery tester label and the battery housing. The thermal insulation means may comprise, inter alia, a layer of release paper, plastic strips, foamed plastic, foamed ink, embossed or printed inks, adhesives, cloth and the like. These insulation materials may be deployed as substantially continuous layers or as discontinuous arrangements defining one or more air pockets between the conductive layer and the battery housing. Indeed, because of the extremely low thermal conductivity of air, when the insulating material is discontinuous in layout, the insulating characteristics of the composite thermal insulation means, i.e., insulation material and air gaps, are superior to a continuous layer of insulating material having no air gaps. U.S. Pat. No. 5,223,003 in particular discloses thermochromic battery tester thermal insulation means including solid spacers formed of foamed plastic and shaped to define an air pocket. It will be appreciated that such a construction combines the thermal insulation benefits of the air pocket, the plastic material and air contained in the plastic material.

When cured, foamed plastics or inks comprise a matrix of plastic or ink material which entraps bubbles of a gaseous matter, most commonly air. It is axiomatic that there is a direct relationship between the volume of entrapped gas and the thermal insulation characteristics of the insulation material: the greater the volume of entrapped gas, the more thermally insulative the material, and vice versa. However, there is an inverse relationship between entrapped gas volume and the structural strength of the insulating material. That is, as the "hollow" or "void" space of a foamed plastic increases, the material's ability to resist externally applied compressive force decreases, and vice versa. Hence, the volume of entrapped gas cannot exceed a threshold level which would compromise the insulating structure's capacity to withstand externally imposed forces associated with ordinary manufacturing shipping, handling and usage of a typical battery. Yet, this threshold entrapped gas level may not be sufficient to impart a meaningful contribution to the thermal insulation characteristics of the material.

A need exists, therefore, for a thin thermal insulation means for a thermochromic battery tester that combines optimum thermal insulation properties with high structural strength and that will function effectively with any battery of conventional dimensions.

SUMMARY OF THE INVENTION

The present invention contemplates novel thermal insulation means, a thermochromic battery tester device incorporating such thermal insulation means, a battery label including such a tester device, a battery including such a battery label, and methods of constructing the thermal insulation means, thermochromic battery tester device, battery label and battery.

The thermal insulation means of the present invention preferably comprises at least one layer of flexible, thermally insulative, dielectric matrix material within which is embedded structurally strong thermally insulative material. A presently preferred material for these purposes is a plurality of miniature spheres usable alone or in combination with other insulative materials such as fibrous and/or particulate materials. The spheres are preferably hollow and encapsulate a thermally insulative substance, desirably a gaseous substance such as air. The spheres themselves may be fabricated from any thermally nonconductive substantially rigid material such as glass or plastic that can be formed into extremely small spheres by processes known in the art. Moreover, by virtue of their spherical shape, which shape inherently possesses exceptional force distribution and force transmission characteristics, the spheres provide an excellent means for resisting the impacts and other mechanical shock normally encountered by a battery.

For best results the sphere-containing thermal insulation means of the present invention is preferably manifested as a random or patterned discontinuous arrangement. Thus, when the thermal insulation means is disposed between a battery housing and a conductive layer of a thermochromic battery tester, one or more air pockets are formed between the conductive layer and the battery housing. In this way, a structurally strong and impact resistant thermal insulation means is realized which makes optimum use of the excellent thermal insulation properties of air, including both the air in the air pockets and that encapsulated in the spheres, in combination with the thermally insulative material from which the spheres are formed and the matrix material within with the spheres are embedded.

The superior thermal insulation characteristics of thermal insulation means according to the present invention thereby functions to enhance performance of a thermochromic battery tester with which the tester may be deployed and to reduce drain on a battery that may be evaluated by such a tester.

More particularly, the present thermal insulation means uses the low thermal conductivity of air to considerable advantage. As a consequence, the tendency of the battery to function as a heat sink for the thermal energy generated by the battery tester's conductive layer is effectively vitiated by the instant thermal insulation means. This virtual thermal isolation of the tester's conductive layer from the battery housing enables the tester to rapidly provide a reliable reading of a battery's strength. That is, essentially all of the thermal energy created when battery current passes through the conductive layer of the battery tester is beneficially directed toward the thermochromic material of the battery tester and not uselessly dissipated by the battery. This phenomenon, in turn, causes the heat sensitive thermochromic material to rapidly achieve a threshold temperature sufficient to produce a visible change in the thermochromic material. Consequently, a user can obtain in about one second or less a reliable reading of a battery's capacity. By contrast, comparably constructed thermochromic battery testers heretofore known in the art may take several seconds to achieve a meaningful reading, especially when the battery's power level is low.

In addition, because the heat generated by the conductive layer of the battery tester is put to more efficient use when associated with the thermal insulation means of the present invention, and also because less time is required to perform a test, less current is drawn from the battery during a test procedure. Therefore, use of a thermochromic battery tester label incorporating the thermal insulation means of the present invention reduces drainage of a battery's energy supply and prolongs the useful service life of the battery.

Moreover, by virtue of its low thermal conductivity, the instant thermal insulation means may be used with conductive layers having greater resistance than those presently employed in thermochromic battery tester labels. Alternatively, the thermal insulation means of the present invention may permit a reduction in the volume of material required for conductive layers formed from conventional materials. In either case, the time required to perform a reliable battery test may be even further reduced. And, the materials and fabrication costs of a tester device incorporating the present thermal insulation means may be correspondingly reduced.

Other details, objects and advantages of the present invention will become apparent as the following description of the presently preferred embodiments and presently preferred methods of practicing the invention proceeds.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE INVENTION

Figure 1A:
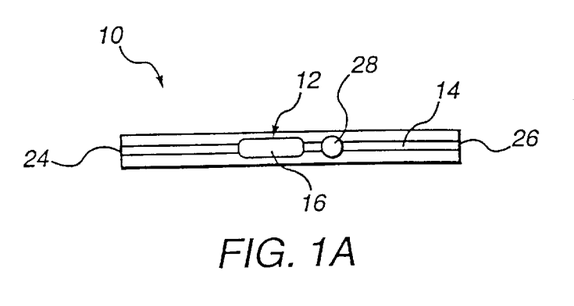
FIG. 1A is a top plan view of a first preferred embodiment of a battery tester device according to the present invention.

Referring to the drawings wherein like reference characters designate like or corresponding parts throughout the several views, there is shown in FIG. 1A a battery tester device according to a first presently preferred embodiment of the invention, which device is identified generally by reference numeral 10. Tester device 10 comprises indicating means preferably constructed as an at least partially transparent indicating chamber 12 in responsive contact with a portion of an electrically conductive material layer 14. The indicator chamber 12 contains at least one layer of thermally sensitive indicating material 16 which undergoes a visible change when subjected to a predetermined threshold temperature.

Figure 1B:
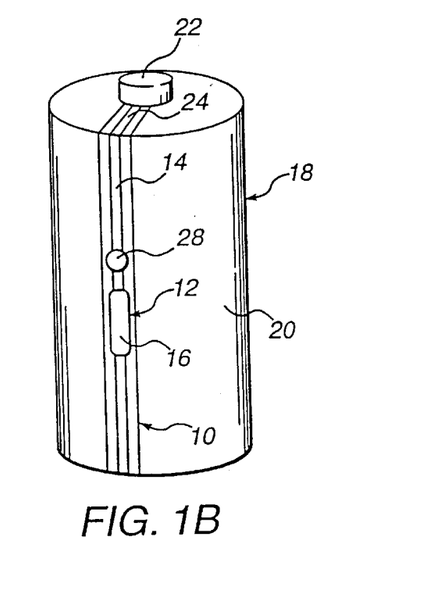
FIG. 1B is a perspective view of the battery tester device of FIG. 1A incorporated into a label affixed to a battery.

FIG. 1B depicts a battery 18 encased by a label 20 which incorporates the battery tester device 10. Battery 18 has an anode or first terminal 22 at one end thereof and a cathode or second terminal at an opposite end (not shown). As is known in the art, the external housing of the battery 18 extending between the first and second ends of the battery may be fabricated from metal. In many such instances the metal housing may be in electrical communication with one of the anode or cathode. Accordingly, the metal housing is electrically insulated from the other of the cathode and anode. Under those circumstances, the metal battery housing effectively serves as an extension of either the anode or cathode to which it is electrically connected.

The opposite ends of the conductive layer 14 define first and second terminals 24, 26 which are adapted for respective contact with the first and second terminals of battery 18. The conductive layer 14 may suitably comprise any conductive material such as metal or metal alloy preferably formed as a thin film. Conductive layer 14 may be preformed and then attached to a substrate such as a dielectric material including, without limitation, paper, plastic or cloth. Alternatively, as will be described in greater detail in connection with the discussion of FIG. 5, conductive layer 14 may comprise a layer of metallized coating or ink which is applied on a suitable substrate. Moreover, the conductive layer 14 may assume any desired shape. For optimum performance, however, the configuration of the conductive layer 14 should be such that its resistance in the region corresponding to the indicator chamber 12 is at least as great as in the remainder of the conductive layer. The heat generated by the conductive layer 14 is dependent on its own inherent resistance, as well as the voltage and current output and thus the strength of a battery, e.g., battery 18, that is to be tested by tester device 10.

The indicating material 16 can be any thermochromic material such as liquid crystal compositions and thermochromic inks, among others, that will undergo a visible change when the voltage of the battery 18 drops below or, more typically, exceeds a predetermined voltage. The indicating material 16 may be such that its visible change occurs as a one-time irreversible event. More preferably, however, the visible change is reversible in order that the battery may be repeatedly tested at the discretion of the user. The visible change may be a color change such as from a color to colorless, colorless to a color, or one color to another color.

Suitable indicating materials may include thermally sensitive liquid crystal compositions such as those of cholesteric type including cholesteryl oleate, cholesteryl chloride, cholesteryl caprylate and the like. Examples of suitable thermochromic inks include those comprised of a dye, developer and desensitizing agent that are disclosed in U.S. Pat. No. 4,835,475, herein incorporated by reference.

The indicating materials such as thermochromic inks can be used singly or combination. For example, different layers of indicating materials could be employed whereby the different layers are activated at different temperatures and can be designed to change different colors at different temperatures. Such an arrangement may be useful in establishing a quantitive gradient type indicator means at a particular ambient temperature or a qualitative indicator means that may provide reliable readings at varying ambient temperatures.

The tester device 10 may also be fabricated so that it indicates a quantitive measure of a battery's capacity such as a load or no-load voltage threshold. For example, one can select a no-load voltage threshold which is indicative that the battery is about 25% exhausted, about 50% exhausted, etc., as may be suitable for intended purposes. Alternatively, the cross sectional area of the conductive layer 14 may be varied in the region thereof corresponding to the indicator chamber 12. In this way, a gradient of heat may generated along the conductive layer 14 during testing. This heat in turn is transferred to the indicating chamber 12 and the indicating material 16 contained therein. Under these circumstances, the tester device 10 or the battery label 20 within which it may be incorporated is preferably provided with a calibrated indicating scale to display the remaining capacity of the battery being tested. Still further, the indicating chamber 12 and indicator material 16 may be designed to convey a simple qualitative measure of the battery's condition such as a "GOOD" or "REPLACE" message.

In addition, the dimensions and resulting resistance of the conductive layer 14 can be adjusted for any battery size, voltage or current requirements. And, from Ohm's law the battery tester device 10 can be calibrated for volts, current, remaining service life, state of charge, or any combination thereof.

When mounted to a battery such as battery 18 the tester device 10 may be in continuous contact with the first and second terminals of the battery. As such, the device 10 will continuously operate and the indicator chamber 12 will undergo a visible change only when the output voltage of the battery falls below a predetermined value. The disadvantage of continuous operation, however, is that such a tester device imposes a constant drain on the battery's energy supply.

Figure 2A:
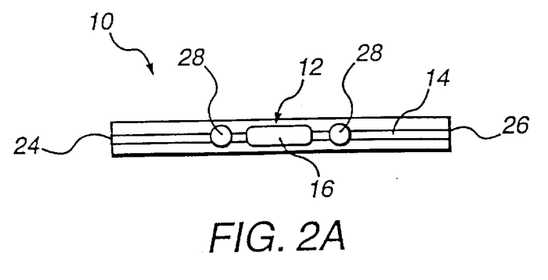
FIG. 2A is a top plan view of a further preferred embodiment of a battery tester device according to the present invention.
Figure 2B:
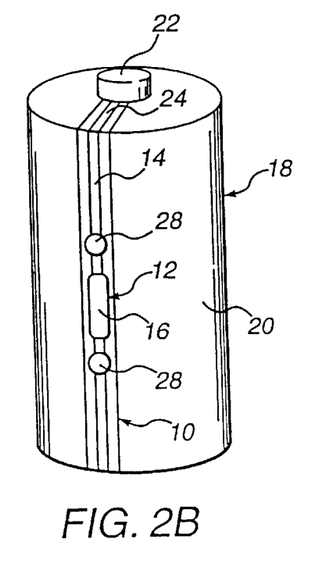
FIG. 2B is a perspective view of the battery tester device of FIG. 2A incorporated into a label affixed to a battery.

It is more preferable that the tester device 10 include at least one switch 28 (as in FIGS. 1A and 1B) or two switches 28 (as in FIGS. 2A and 2B). The benefit of at least one switch 28 is that the tester device 10 is normally biassed to be in an "OFF" state. Hence, the tester device is only activated when the switch 28 is on, thus preventing a constant drain on the battery. The construction and operation of switch 28 is best appreciated by reference to FIGS. 3A and 3B.

Figure 3A:
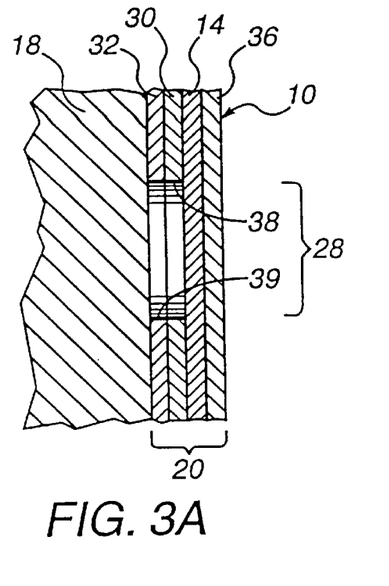
FIGS. 3A and 3B are enlarged cross-sectional views of a switch portion of the battery tester according to FIGS. 1A and 1B affixed to a battery and depicting the switch of the tester device in deactivated and activated condition, respectively.
Figure 3B:
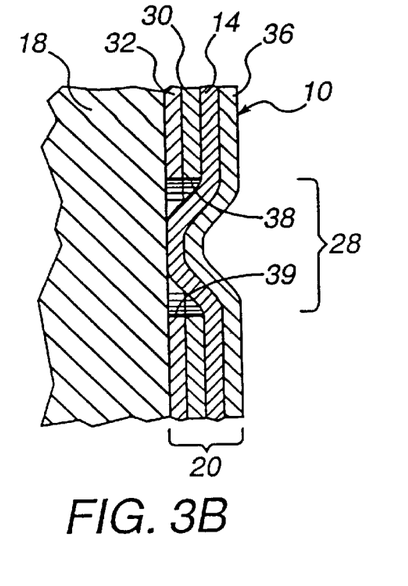
Figure 3C:
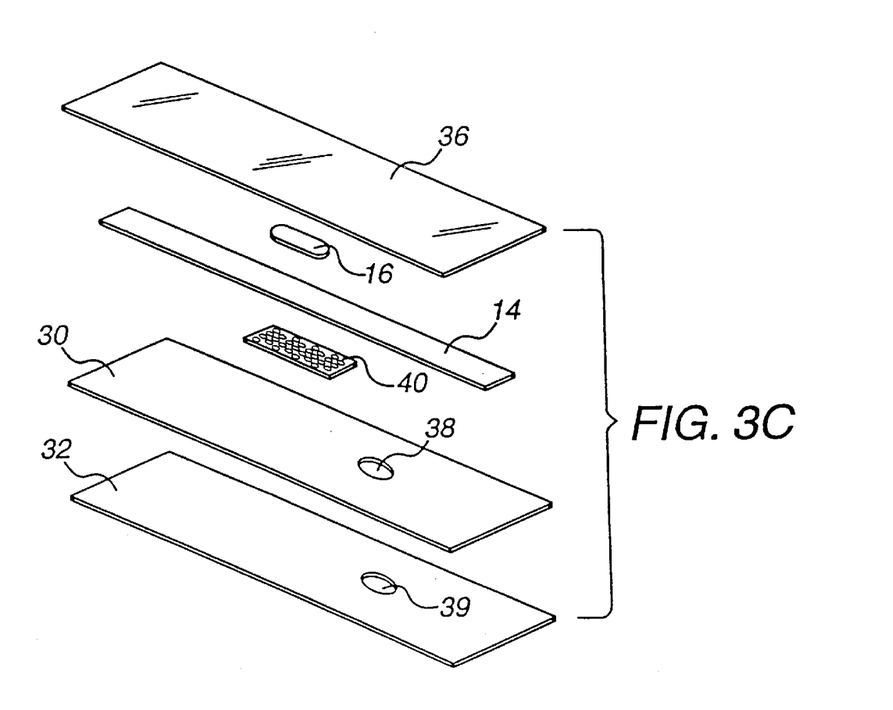
FIG. 3C is an exploded view of the essential layers of a thermochromic battery tester device arranged in accordance with the present invention.

As seen in FIGS. 3A and 3B, a portion, in particular the switch portion, of a battery label 20 incorporating a tester device 10 according to the present invention is shown affixed to a battery 18. FIG. 3C provides an exploded view of the essential components of the tester device 10 in an arrangement consistent with the present invention. Referring collectively to FIGS. 3A, 3B and 3C, the battery label 20 preferably comprises a flexible substrate layer 30 of dielectric material such as paper, cloth or, more preferably, a polymeric material such as polyethylene, polyester, polypropylene or polyvinylchloride which may be metallized or non-metallized. The dielectric material is chosen so as to provide a measure of electrical and thermal insulation between the battery 18 and the working elements of the battery tester. Disposed between the battery 18 and the flexible substrate layer 30 is a layer of adhesive 32 which may be any conventional pressure sensitive or curable adhesive. Desirably, adhesive layer 32 is a pressure sensitive adhesive carried by the substrate layer 30 for facilitating high speed placement of the label 20 onto the circumference of the battery 18 using conventional label attachment apparatus and methods.

Disposed on the surface of the substrate layer 30 opposite adhesive layer 32 is the conductive layer 14. To minimize the cross-sectional profile of the battery label 20 the conductive layer 14, as previously mentioned, preferably comprises a thin layer of conductive material such as metallized coating or ink which may be deposited on substrate layer 30 using conventional coating or printing techniques. This conductive material may be, for example, silver, nickel, iron, copper, lead and the like, or mixtures thereof, and is preferably dispersed in a binder material to form a conductive ink. Silver is the preferred material and preferred thicknesses of the conductive layer are contemplated to be about 0.0001 to about 0.002 inch (about 0.00254 to about 0.0508 mm).

According to a presently preferred construction, the thermochromic indicating material 16 is deposited at a desired location on the surface of the conductive layer 14 opposite the substrate layer 30. With the indicating material so placed, the label 20 also should comprise an outer protective layer 36 preferably formed from a film material similar to substrate layer 30. The protective layer 36 would thus enclose the label assembly and define the sealed indicating chamber 12 for indicating material 16 shown in FIGS. 1A, 1B, 2A, 2B and 5. To assure perception of visible changes in the indicator material 16 during a battery test, the protective layer should be at least partially transparent in the region thereof corresponding to the indicating chamber 12.

The indicating chamber 12 may also be formed in other acceptable ways. For example, an intermediate layer may be provided as two sublayers whereby the indicator material 16 may be deposited at a desired location on one of the sublayers. Thereafter, the sublayers may be laminated together and then applied to the conductive layer 14, thereby rendering the protective layer 36 optional.

It will be understood that the layers described above represent a presently preferred embodiment of label 20 and can be altered, rearranged or assembled in many ways to provide the label 20 with a battery tester circuit. Moreover, the labels useful in the present invention may comprise additional insulation layers, graphics layers, protective layers, and the like. Suitable materials for use as the different layers are those typically used in battery labels and include plasticized or unplasticized polyvinyl chloride, metallic films, paper and the like, and they may be prepared and applied by known methods such as coating, printing and laminating the layers together. Further, the label 20 and any variants thereof within the scope of the present invention can be made in the form of individual sheets having a seam or as a shrinkable tube in which a battery may be encased. To prepare the label 20 as a shrinkable tube, after forming the label as generally described above, the label is placed around a mandrel and welded lengthwise to form a tube. The tube is then flattened, and wound on a roll whereupon it is ready for use.

Additionally, the above described thermal insulation means, tester device and battery label of the present invention may be used with a dry cell battery (as described) or a wet cell battery, and with both rechargeable and non-rechargeable batteries.

Comparison of FIGS. 3A and 3B reveals that the tester label 20 is activated by depressing the label in the area of switch 28. To assure proper functioning of the switch 28, the substrate layer 30 is preferably provided with an opening 38. Because of the presence of opening 38 in substrate layer 30, a similar opening 39 is created in adhesive layer 32 in alignment with opening 38, which openings are also shown in FIG. 3C. Accordingly, the portion of the conductive layer 14 associated with the switch 28 may pass through openings 38 and 39 upon depression of the switch and contact the battery housing, thereby closing the tester circuit to initiate a testing procedure. Removing pressure from the switch 28 allows the conductive layer 14 in the region of the switch 28 to retract to the position shown in FIG. 3A, thereby opening the switch and ceasing the test procedure.

In the tester device shown in FIGS. 2A and 2B, wherein two switches 28 are provided, both switches must be simultaneously depressed to carry out a testing procedure.

Figure 4:
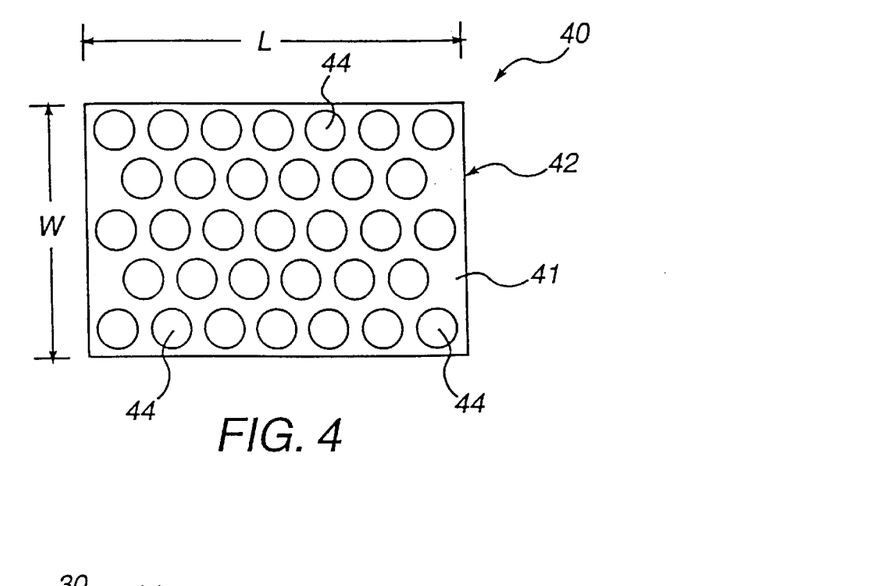
FIG. 4 is a top plan view of thermal insulation means constructed according to the present invention.
Figure 5:
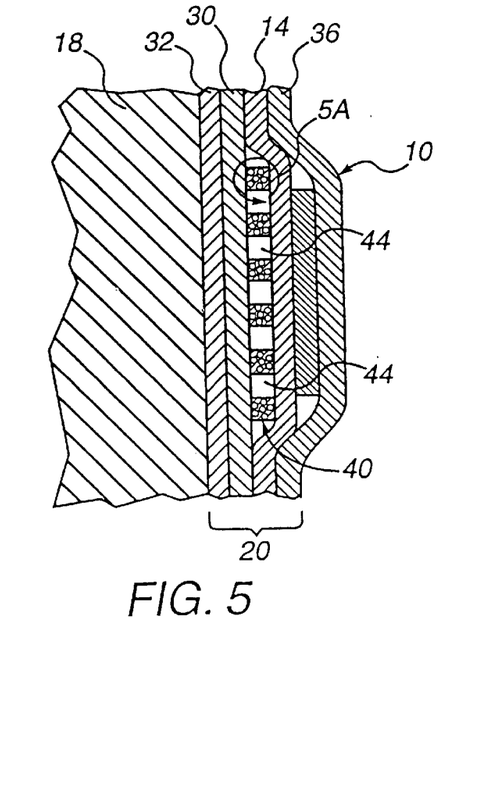
FIG. 5 is an enlarged cross-sectional view of the thermal insulation means of FIG. 4 disposed in a battery label affixed to a battery, the combination of which also forms a part of the present invention.
Figure 5A:
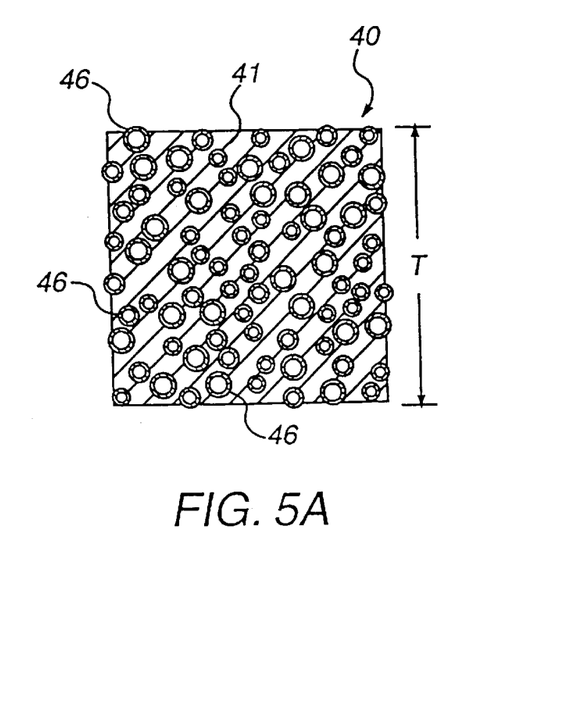
FIG. 5A is an even further enlarged cross-sectional view of the thermal insulation of the present invention encircled within arrow 5A of FIG. 5.

FIGS. 4, 5 and 5A illustrate on an enlarged scale, the particulars of a presently preferred embodiment of thermal insulation means constructed in accordance with the present invention, which means are generally identified by reference numeral 40. It will be appreciated that the dimensional aspects of the thermal insulation means 40 and the other layers of the label 20 are greatly exaggerated to clearly represent the structural features of the invention. In an actual construction, the composite structure of label 20 in the region of the indicating chamber would be virtually flat. As such, the presence of the tester device constitutes a negligible contribution to the cross-sectional profile of the battery label and, from a tactility perspective, is essentially indistinguishable from the remainder of the battery label. As shown in FIGS. 3C and 5, thermal insulation means 40 is disposed so as to be in general alignment with the indicating chamber 12. Thermal insulation means 40 may be located on the surface of the substrate layer 30 opposite conductive layer 14. Preferably, however, the thermal insulation means 40 is situated, as illustrated, between the conductive layer 14 and the substrate layer 30. The thermal insulation means may be preformed as a separate component and then applied to either the substrate layer 30 or the conductive layer 14. According to a presently preferred method, thermal insulation means 40 is applied by coating or printing substrate layer 30 with a discrete quantity of curable ink or similar coating material using standard lithographic, flexographic, gravure or screen printing processes.

The thermal insulation means 40 preferably comprises at least one layer of thermally insulative dielectric matrix material 41 such as a dielectric ink or a similar coating composition which is applied to substrate layer 30. The preferred thickness of the matrix material 41 is from about 2 to about 5 mil in order to minimize the cross-sectional profile of a label within which tester device 10 may be incorporated. Most preferably, thermal insulation means 40 is applied to substrate layer 30 in a discontinuous arrangement 42. The areal dimensions of the discontinuous arrangement 42, as indicated by length "L" and width "W" in FIG. 4, should be at least as great as those of the indicating chamber 12 (FIGS. 1A, 1B, 2A and 2B). Most preferably, the area of the discontinuous arrangement 42 is somewhat greater than that covered by the indicating chamber 12. By exceeding the perimetrical boundary of the indicating chamber 12, the discontinuous arrangement 42 assures that heat generated by the conductive layer 14 in the region of the indicating chamber 12 is effectively isolated from an underlying battery and advantageously directed toward the indicating chamber.

The discontinuous arrangement 42 may be a random or amorphous shape. Preferably, however, the discontinuous arrangement defines an identifiable pattern, an illustrative but non-limitative example of which is depicted in FIG. 4. In that figure, the pattern established by the discontinuous arrangement 42 is a generally open lattice configuration defining a plurality of air pockets 44. Air pockets 44 may be any polygonal or curvilinear shape and can be of uniform or non-uniform sizes. The pattern for defining the air pockets 44 does not necessarily have to produce one or more air pockets of closed-cell configuration. That is, the discontinuous arrangement 42 may be simply a plurality of substantially parallel rows of material, which rows may be straight, curved, sinusoidal, saw-toothed or otherwise defining an identifiable pattern, whereby one or both ends of individual air pockets bounded by the rows of material may be open at the perimeter of the discontinuous arrangement.

The term "discontinuous" when used to describe the discontinuous arrangement 42, therefore, merely means that the thermal insulation means 40 of the present invention defines a practical measure of open space within its areal boundaries. This open space, i.e., one or more air pockets 44, must provide a meaningful "air gap" contribution to the thermally insulative characteristics of the thermal insulation means 40. A significant degree, although not necessarily a preponderance, of open space thus distinguishes the discontinuous arrangement 42 of thermal insulation means 40 from typical "continuous", i.e., substantially imperforate, thermal insulation means such as, for example, an unbroken layer of dielectric ink, an unbroken sheet of paper or plastic film, tightly woven cloth or densely constructed non-woven cloth.

As perhaps most clearly seen in FIG. 5A, which is a further enlarged cross-sectional view of the thermal insulation of FIG. 5 encircled by arrow 5A, thermal insulation means 40 further comprises means 46 embedded in the matrix material 41 of the discontinuous arrangement 42 for enhancing the structural strength of the thermal insulation means. Means 46 may comprise any suitable thermally insulative material, for example, fibrous or particulate material or, more preferably, a plurality of miniature spheres usable alone or in combination with other strength-enhancing insulative materials, e.g., the aforementioned fibrous and/or particulate materials. The spheres 46 are preferably hollow and encapsulate a thermally insulative substance, desirably a gaseous substance such as an inert gas (e.g., argon, neon, helium, and the like) or air which, most preferably, has been dehumidified prior to encapsulation. The spheres 46 may be fabricated from any substantially rigid material such as glass or plastic (e.g., styrene acrylic polymers and the like) that can be formed into extremely small spheres of from between 0.4 $\mu$m to about 50 $\mu$m in diameter by processes known in the art. Suitable spheres for purposes of the present invention include glass spheres manufactured by Potters Industries Inc. of Parsippany, N.J. having mean particle sizes of less than about 50 $\mu$m, more preferably less than 20 $\mu$m, and most preferably less than about 10 $\mu$m.

As mentioned previously, the thermal insulation means 40 may be preformed into a predetermined discontinuous arrangement 42 and thereafter applied to substrate layer 30 (FIG. 5). Alternatively, and more preferably, the thermal insulation means 40 may be applied as a curable dielectric ink or similar coating to the appropriate surface of substrate layer 30 and in the desired discontinuous arrangement 42 using conventional printing or coating processes. In either case, the spheres 46 may be added to the matrix material of the thermal insulation means after deposition of such material. More preferably, however, the spheres 46 are combined and mixed with the matrix material prior to deposition to ensure substantially uniform distribution of the spheres throughout the matrix material upon deposition thereof.

Because of their substantially spherical shape, which shape inherently possesses exceptional force distribution and force transmission characteristics, the spheres 46 provide an excellent means for resisting the impacts and other mechanical shock encountered by a battery under normal manufacturing, shipping, handling and usage.

The thickness "T" (FIG. 5A) of the thermal insulation means 40, including spheres 46 embedded therein, need not exceed more than about 5 mil. Such thickness has been discovered to be sufficient to reconcile the heretofore conflicting objectives of high structural strength, exceptional thermal insulation capacity and low cross-sectional profile.

The thermal insulation means 40 of the present invention beneficially combines the thermal insulation properties of the air pocket(s) 44, the material of which the spheres 46 are formed, the air encapsulated in the spheres, and the matrix material (e.g., dielectric ink) which binds the spheres into a cohesive mass.

The virtually complete thermal insulation provided by thermal insulation means 40 thus effectively eliminates the tendency of a battery to function as a heat sink for the thermal energy generated by the conductive layer 14 of the battery tester device 10 when the tester device is incorporated into a battery label such as label 20. This virtual thermal insulation of the tester device conductive layer 14 from the battery housing enables the tester device to rapidly provide a reliable reading of a battery's capacity. That is, nearly all of the thermal energy created when battery current passes through the conductive layer 14 in the region of the indicating chamber 12 is directed toward the thermochromic material 16 contained within the indicating chamber and not uselessly dissipated by the battery. This phenomenon, in turn, causes the heat sensitive thermochromic material 16 to achieve a threshold temperature sufficient to produce a rapid visible change in the thermochromic material. Consequently, a user can obtain in about one second or less a reliable reading of a battery's capacity. By contrast, comparably constructed thermochromic battery testers heretofore known in the art may take several seconds to achieve a meaningful reading, especially when the battery's power level is low.

In addition, because the heat generated by the conductive layer 14 of the battery tester 10 is put to more efficient use when associated with the thermal insulation means 40 of the present invention, and also because less time is required to perform a test, less current is drawn from the battery during a test procedure. As a consequence, use of a thermochromic battery tester label 20 incorporating thermal insulation means 40 reduces drainage of a battery's energy supply and thereby prolongs the useful service life of the battery.

Moreover, by virtue of its low thermal conductivity, the instant thermal insulation means 40 may be used with electrically conductive layers having greater resistance than those presently employed in thermochromic battery tester labels. Alternatively, the thermal insulation means of the present invention may permit a reduction in the volume of material required for conductive layers formed of conventional materials. In either case, the time required to perform a reliable battery test may be even further reduced. And, the materials and fabrication costs of a tester device incorporating the present thermal insulation means 40 may be correspondingly reduced.

The instant thermal insulation means additionally blends these advantageous thermal insulation characteristics with the considerable inherent structural strength of the spheres 46 into a rugged structure capable of withstanding the externally applied forces and similar mechanical rigors unique to battery-mounted thermochromic tester labels.

Figure 6:
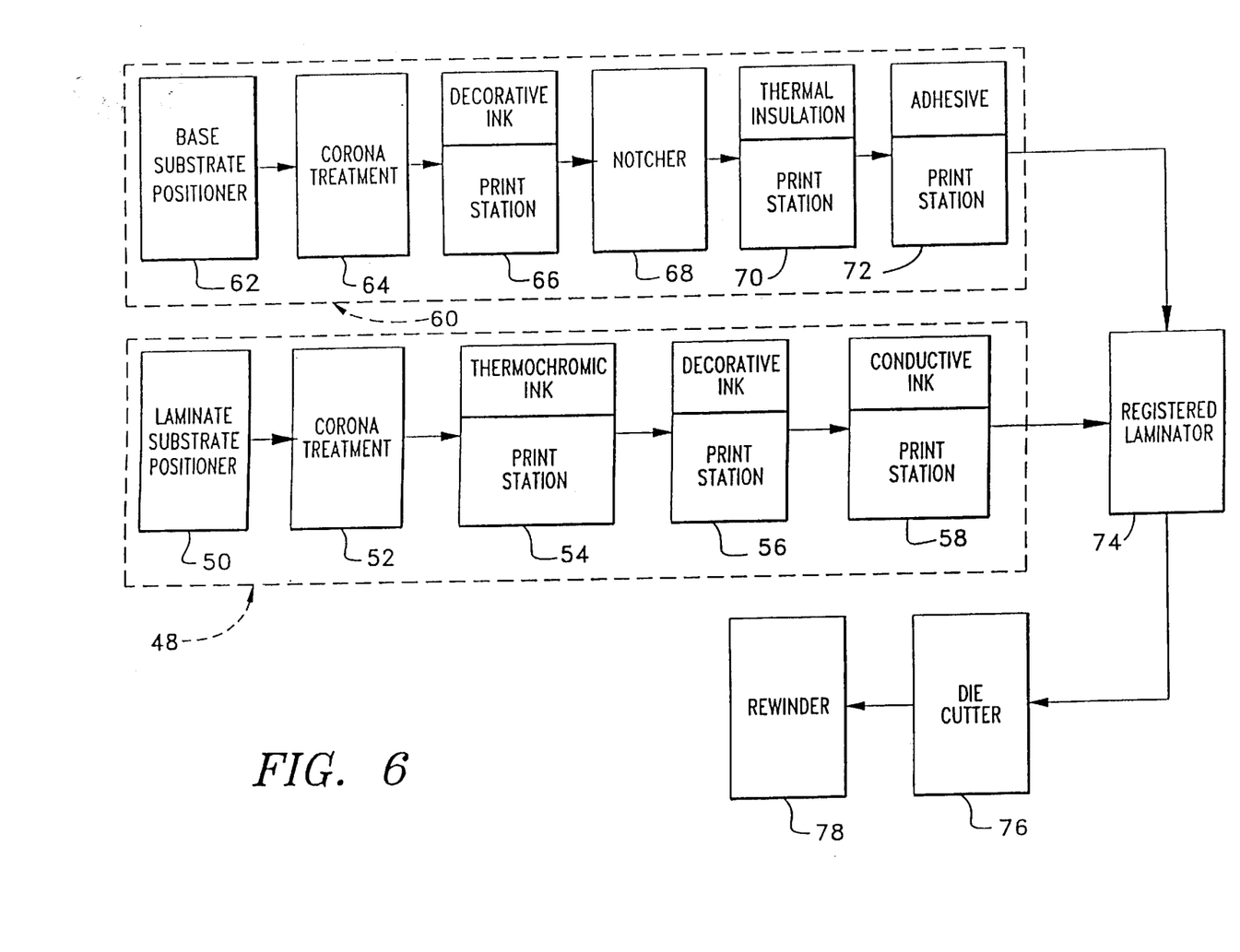
FIG. 6 is a schematic view of an apparatus and method for assembling a thermochromic battery tester device according to the present invention.

Referring to FIG. 6 there is shown an exemplary and presently preferred, although not limitative, system for high speed manufacturing of thermochromic battery tester devices 10 according to the present invention.

Construction of the tester devices may be carried out in a "single pass" by printing all graphic and functional layers of a tester device on a single, flexible base substrate such as substrate 30 which may or may not be enclosed by a protective outer layer 36, as reflected in FIG. 3C. Alternatively, as depicted in FIG. 6, a tester device may be constructed by printing only selected graphic and/or functional layers on selected ones of two or more flexible substrates and then joining the individual substrates together, in a manner to be described hereinafter, to form the completed tester device 10. The combination of functional elements of the tester device, graphics and other matter applied to each individual substrate may be collectively referred to as a "pass". Where there are two or more passes made during the construction of a tester device, as there is in the presently preferred system depicted in FIG. 6, each pass is identified herein by number, as for example, "first pass", "second pass", etc. In multiple pass constructions, once each pass has been printed, the several passes are brought into precise registration with one another and joined to form the completed tester device.

The first pass of the battery tester manufacturing and assembling process revealed in FIG. 6 is schematically depicted as area 48. The "first pass" is that processing pass in which substrate 36 undergoes treatment. The processing means by which first pass 48 is constructed generally comprises a laminate substrate positioner 50, an optional corona treatment station 52, at least one thermochromic ink print station 54, optional decorative ink print station(s) 56, and at least one conductive ink print station 58.

The second pass of the embodiment disclosed in FIG. 6 is schematically depicted as area 60. The "second pass" is that processing pass in which base substrate 30 undergoes treatment. The processing means by which second pass 60 is constructed generally comprises base substrate positioner 62, an optional corona treatment station 64, optional decorative ink print station(s) 66, a notcher 68, as least one thermal insulation print station 70, and adhesive print station 72.

Prior to printing on substrates 30 and 36, it is generally preferable to corona treat the substrates to raise their surface tension or "dyne" levels, thereby enhancing the adhesion of printing inks to the substrates. As is known, corona treatment imparts a high voltage, low current, electrical charge to the surfaces of the substrate. Similar results may likewise be achieved using plasma treatments and/or other electrical, mechanical and chemical surface tension enhancement treatments known in the art.

If the dyne level of the substrates 30 and 36 is too low, printing inks will tend to adhere in a non-uniform manner and possibly form ink beads of non-uniform thickness on the surfaces of the substrates. However, if the substrate dyne level is sufficiently raised, the inks will tend to adhere more uniformly and with consistent thickness over the surface of the substrates.

Returning to the presently preferred processing steps of the two pass embodiment of the present invention depicted in FIG. 6, first pass 48 is constructed by first positioning, via laminate substrate positioner 50, substrate 36 in corona treatment station 52 where the dyne level of substrate 36 is increased. Substrate 36 is then positioned in at least one thermochromic ink print station 54 where thermochromic indicating material 16 of desired configuration and thickness is deposited on the substrate. Thereafter, the substrate is positioned into one or more optional decorative ink print station(s) 56 wherein decorative inks may be applied. The inks may be of the same or different colors. Lastly, substrate 36 is positioned in at least one conductive ink print station 58 where conductive layer 14 is applied.

Second pass 60, which may be processed simultaneously with or at a different time than first pass 48, is constructed by positioning base substrate 30 in corona treatment station 64 via base substrate positioner 62. From there, the base substrate 30 may be introduced into one or more optional decorative ink stations 66 for applying at least one layer of decorative ink of one or more colors. The base substrate 30 may then be introduced into a notcher or similar perforation station 68 for creating the aforementioned switch opening(s) 38 (FIGS. 3A and 3B).

Following notching, the base substrate 30 may be coated at at least one thermal insulation print station 70 with thermal insulation material to produce thermal insulation means 40. As a final treatment operation, the second pass 60 concludes with a layer of adhesive being applied by adhesive print station 72 to the surface of substrate 30 intended to be laminated to first pass 48.

First and second passes 48 and 60 may be assembled in simultaneous or separate operations. When printed simultaneously, the first and second passes are preferably printed on substantially parallel rotogravure or similar presses. The printed first pass 48 is then brought into precise registration with and laminated to second pass 60 at a registered laminator 74 as described below. The composite structure then preferably proceeds through an optional die cutter 76 to separate individual printed tester devices and a rewinder 78. Prior to rewinding, the composite structure is preferably provided with a layer of pressure sensitive adhesive (e.g., element 32 of FIG. 3C) and a release means such as release paper (not shown) to enable rewinding and storage of the testers devices, as well as to facilitate subsequent attachment of the tester devices to individual battery housings.

When printed in separate operations, the first pass 48 is fully printed and then placed into roll or other form suitable for further processing at a later time. The roll comprising the first pass is then mounted to an unillustrated infeed unit at the registered laminator 74. As second pass 60 is printed and delivered to the registered laminator 74, the first pass is simultaneously unwound, placed into precise registration with the second pass and laminated to the second pass at the registered laminator 74. The composite structure so produced may then proceed to die cutting and rewinding stations 76 and 78.

In two or more pass constructions, it is essential to the successful assembly and operation of a tester device that the individual passes are aligned and joined together such that the various functional components of the device are in proper electrical communication with one another and that the graphic layers are aligned to produce the desired visual effect. To do so, the various passes are preferably aligned and joined together through an automated and continuously self-adjusting registration and lamination process at registered laminator 74.

Registered lamination in accordance with the present invention may be achieved via suitably configured and cooperating automatic web tension control means (not illustrated) employed in conjunction with cooperating automatic web registration means (also not illustrated) working in concert at registered laminator 74 to produce two or more pass tester devices. An exemplary arrangement may include a model number S-3000 web registration control device and a model number S-2152 web tension control device, both manufactured by The Bobst Group, Inc. of Roseland, N.J. Such a system may be used to control the first pass 48 as it is unwound from the infeed unit at the registered laminator and joined with the second pass 60 as the second pass exits the press. Alternatively, registered laminating may be carried out in an off-line process where both passes 48, 60 have been previously printed and rewound.

Critical to the automated registered lamination process is to continuously monitor the stress characteristics of each pass 48, 60 during production. Improper stress placed on first pass 48, for instance, which pass is typically stretched relative to pass 60 during lamination, may cause delamination or curling of the passes once joined.

To achieve precise, substantially real-time control, the registered laminator preferably further comprises web position sensing means (not shown) for monitoring certain physical characteristics of the first and/or second passes 48 and 60 as they traverse the registered laminator. Such web sensing means are preferably electronically connected to a suitable system control device, e.g., a microprocessor (not shown), which continuously monitors the web sensing means and simultaneously controls the functions of the web tension control means and the web registration control means responsive to web position data received from the web sensing means. The web tension control means and web registration control means are preferably adaptable to control the relative tensions and registrations of either or both of the first and second passes 48, 60.

Although the invention has been described in detail for the purpose of illustration, it is to be understood that such detail is solely for that purpose and that variations can be made therein by those skilled in the art without departing from the spirit and scope of the invention except as it may be limited by the claims.

What is claimed is:

1. A battery tester device comprising:

a first dielectric layer;

a conductive layer adjacent said first dielectric layer;

a temperature sensitive indicator layer in thermal contact with said conductive layer; and thermal insulation for thermally insulating said conductive layer from a battery suitable for testing by said battery tester device, said thermal insulation being disposed adjacent said conductive layer and comprising a second dielectric layer and thermally insulative means combined with said second dielectric layer for enhancing the structural strength of said thermal insulation.

2. The battery tester device of claim 1 wherein said thermal insulation is disposed between said first dielectric layer and said conductive layer.

3. The battery tester device of claim 1 wherein said second dielectric layer is configured as a discontinuous arrangement defining at least one air pocket.

4. The battery tester device of claim 3 wherein said discontinuous arrangement is an open lattice configuration.

5. The battery tester device of claim 2 wherein said thermally insulative means comprises a plurality of spheres.

6. The battery tester device of claim 5 wherein said spheres are hollow.

7. The battery tester device of claim 6 wherein said spheres contain air.

8. The battery tester device of claim 5 wherein said spheres are formed from glass or plastic.

9. The battery tester device of claim 5 wherein the diameter of said spheres is less than about 50 $\mu$m.

10. The battery tester device of claim 1 wherein said second dielectric layer comprises dielectric ink.

11. The battery tester of claim 1 wherein said second dielectric layer is no greater than about 5 mil thick.

12. The battery tester of claim 1, wherein the battery tester device is incorporated into a label.

13. A battery having a label with an integral battery tester device, wherein the battery tester device comprises:

a first dielectric layer;

a conductive layer adjacent to said first dielectric layer;

a temperature sensitive indicator layer in thermal contact with said conductive layer; and thermal insulation for thermally insulating said conductive layer from a battery suitable for testing by said battery tester device, said thermal insulation being disposed adjacent said conductive layer and comprising a second dielectric layer and thermally insulative means combined with said second dielectric layer for enhancing the structural strength of said thermal insulation.

14. The battery of claim 13 wherein said second dielectric layer is configured as a discontinuous arrangement defining at least one air pocket.

15. The battery of claim 14 wherein said discontinuous arrangement is an open lattice configuration.

16. The battery of claim 13 wherein said thermally insulative means comprises a plurality of spheres.

17. The battery of claim 16 wherein said spheres are hollow.

18. The battery of claim 17 wherein aid spheres contain air.

19. The battery of claim 16 wherein said spheres are formed from glass or plastic.

20. The battery of claim 16 wherein the diameter of said spheres is less than about 50 $\mu$m.

21. The battery of claim 13 wherein said second dielectric layer comprises dielectric ink.

22. The battery of claim 13 wherein said second dielectric layer is no greater than about 5 mil thick.

* * * * *